United States Patent

[11] 3,611,351

[72] Inventors Rudolf K. H. Panschow
Hannover;
Henning A. A. E. A. Bottcher, Ahlen
B/Hannover, both of Germany

[21] Appl. No. 718,871
[22] Filed Apr. 4, 1968
[45] Patented Oct. 5, 1971
[73] Assignee Sina AG
Zurich, Switzerland
[32] Priority Dec. 18, 1967
[33] Switzerland
[31] 17786/67

[54] ELECTRONIC APPARATUS
11 Claims, 4 Drawing Figs.

[52] U.S. Cl. 340/347 AD, 340/347 DA
[51] Int. Cl. H03k 13/02
[50] Field of Search 235/150.53, 154; 340/347

[56] References Cited

UNITED STATES PATENTS

| | | | |
|---|---|---|---|
| 2,827,233 | 3/1958 | Johnson et al. | 340/347 |
| 3,080,555 | 3/1963 | Vadus et al. | 235/154 X |
| 3,196,430 | 7/1965 | Oken et al. | 340/347 |
| 3,264,457 | 8/1966 | Seegmiller et al. | 340/347 X |
| 3,276,012 | 9/1966 | Secretan | 340/347 |
| 3,382,438 | 5/1968 | Geller | 340/347 X |
| 3,239,833 | 3/1966 | Gray | 340/347 |

*Primary Examiner*—Maynard R. Wilbur
*Assistant Examiner*—Charles D. Miller
*Attorney*—Woodhams, Blanchard and Flynn

ABSTRACT: An electronic apparatus, in particular an analog/digital converter having a generator which supplies an output voltage U($n$) in dependence on the number $n$ of applied control impulses and which increases in a desired nonlinear dependence on $n$.

INVENTORS
RUDOLF K.H. PANSCHOW
HENNING A.A.E.A. BOTTCHER
BY
Woodhams, Blanchard & Flynn
ATTORNEYS INVENTORS
RUDOLF K. H. PANSCHOW
HENNING A. A. E. A. BOTTCHER
BY
Woodhams, Blanchard & Flynn
ATTORNEYS

ELECTRONIC APPARATUS

The invention relates to electronic apparatus with a generator to which control impulses are fed over a main control input and which generates an output voltage $U(n)$ dependent for its magnitude on the number $n$ of the control impulses delivered to it.

Electronic apparatus of this type is, for example, an analog-to-digital converter. The known analog/digital converters have as generators, to which control impulses are fed over a main control input and which generate an output voltage $U(n)$ dependent for its magnitude on the number $n$ of the delivered control impulses, a sawtooth generator which either integrates the number impulses delivered as control impulses and provides an output voltage proportional to the integral or which uses only the first of the delivered impulses as a start impulse and thereupon generates a time proportional output voltage. In the latter case obviously the impulse frequency of the delivered impulses is constant.

The output voltage of the sawtooth generator, which increases in proportion to the number $n$ of the delivered control impulses, is compared in a comparator with a voltage analogous to the unconverted data and applied from the analog/digital converter and as soon as the sawtooth voltage has a magnitude equal to this analog voltage, the comparator delivers an output signal that disconnects the number impulse generator delivering the control impulses or interrupts the number impulses lead over which the number impulse generator is connected to a counter which counts out the digital value of the unconverted data. The digital value in the counter after this interruption corresponds in magnitude closely to the magnitude of the analog voltage provided that the number impulses applied to the counter are also applied simultaneously to the sawtooth generator as control impulses and the counter is zeroized at the first number impulse and further the output voltage of the sawtooth generator is zero at the first control impulse formed by the first number impulse.

However, usually in an analog/digital converter the analog value is applied over a transformer and if this transformer has a nonlinear relationship between its output voltage, applied to the analog input of the analog/digital converter, and its input voltage, then the said digital value in the counter, after the interruption of the number impulse lead or the disconnection of the number impulse generator, does not correspond to the input voltage indicating the actual data but on the contrary the output voltage of the transformer, in other words nonlinearity in the transformer leads to errors in the digital values delivered at the output side of the analog/digital converter. From this it follows that for example, an extraordinarily high technical expense must be paid for the transformer to ensure that the output and input voltages of the transformer are linearly related. However, the nonlinearity of the transformer and other nonlinearities of the transfer path from the data source to the analog/digital computer can be equalized in that the output voltage $U(n)$ of the said generator, which in the known analog/digital converters is formed by the said sawtooth generator, increases in a nonlinear dependence on the number $n$ of the control impulses delivered to the generator, said nonlinear dependence compensating for the nonlinearities between the data source and the analog/digital converter.

The basic problem to be solved by the invention is therefore electronic apparatus, in particular an analog/digital converter with a generator which supplies an output voltage $U(n)$ in dependence on the number $n$ of the applied control impulses which increases in a desired nonlinear dependence on $n$.

According to the invention, electronic apparatus of the above type is characterized by a counter with one or more counting inputs connected to a counting stage, connecting means for connecting one of the counting inputs to the main control input, a voltage generator connected to the control inputs of a first part of the counting stages of the counter for producing a first voltage linearly dependent on the state of count of said first part of the counting stages, first means for setting, in dependence on the state of count of the remaining second part of the counting stages of the counter, the voltage change of the first or one of these linearly dependent second voltages for a counting step in the first part of the counting stages, second means for forming a fourth voltage by the addition of a third voltage dependent on the condition of count of the second part of the counting stages to the voltage with adjustable voltage variation or by change of the initial value of the voltage with adjustable voltage variation around the value of such third voltage and third means for presenting the fourth or one of these linear dependent fifth voltages as the output voltage $U(n)$.

Preferably at least the first part of the counting stages of the counter may consist of binary stages. Further the voltage generator may be a step voltage generator of which the output voltage forming the first voltage corresponding to the stage-by-stage increase of the state of count of the first part of the counting stages varies stage-by-stage about a voltage step.

The apparatus can also be constructed practically in that the voltage generator includes a voltage dividing circuit or resistance summing network with on the one hand a first resistor between each binary stage of the first part of the counting stages of the binary counter and a common junction for all the first resistors on the other hand and a second resistor connected to the common junction and that the first resistors are connected to a switching point of the associated binary stage by which in position "1" of the binary stage a voltage which is the same for all binary stages is present over the voltage divider and in position "0" of the binary stage zero voltage is present over the voltage divider which is formed from the first resistor associated with the binary stage and of its second resistor, and in that the resistance value of each of the first resistors associated with an individual binary stage is a multiple of the resistance value of the second resistors and at least approximately one half the resistance value of the first resistors associated with the resistance value of the first resistor associated with the preceding binary stage. Thereby can the second resistor advantageously be in the input resistor of a direct voltage amplifier whose output voltage is the said first voltage. However, it can also be that the first voltage is taken directly from the second resistor.

The apparatus can further be advantageously so constructed that the said first means includes a resistor variable in its value by a first electronic switch or switch means the first voltage being developed across said variable resistor and in that the said first electronic switch or switch means is controlled by the second part of the counting stages.

Instead of this last mentioned construction, the construction can however with advantage be such that said first means includes a first voltage divider or resistance summing network variable in its voltage division ration by first electronic switches or switch means, the first voltage being developed at the input side of said first voltage divider and the second voltage being developed at the output side of said first voltage divider and in that said first electronic switches or switch means are controlled by the second part of the counting stages of the counter.

With regard to the second means, the apparatus can practically be so constructed that the said second means include a second voltage divider or resistance summing network variable in its voltage dividing ratio by a second electronic switch or switch means, a constant voltage being developed at the input side and the fourth voltage being developed at the output side of the second voltage divider and in that said second electronic switches or switch means are likewise controlled by the second part of the counting stages of the counter. This gives different advantageous possibilities for forming the fourth voltage: the voltage with adjustable voltage changes is inserted in the outgoing side of the diagonal or output branch of the second voltage divider in series or it can be inserted in series with the outgoing side of the diagonal branch of the second voltage divider. If said first means consists of a variable resistor to which the first voltage is applied, the possibility also arises that the resistor variable in its resistance value by the first electronic switches or switch means forms the outgoing side of the diagonal branch of the second voltage divider and that the longitudinal or input branch of the second voltage divider is formed by a further resistor variable in its resistance value by the brand electronic switch or switch means.

A particularly advantageous embodiment of the apparatus is attained in that the outgoing side of the diagonal branch of the first voltage divider also forms at the same time the outgoing side of the diagonal branch of the second voltage divider. In this case the apparatus can advantageously be constructed so that the output side of the diagonal branch of the first and second voltage dividers if formed by a constant resistor and a number of fixed resistors are connected at one side of the diagonal branch each of which resistors is connected to the side away from the diagonal branch by two electronic switches of which the one switch belongs to the group of the first electronic switches and on switching through the resistor in question to one of the voltage values of the associated first voltage connects up the constant voltage corresponding to the maximum state of count of the first part of the counting stages and in that control means are provided in order, on a condition of count $k$ of the second part of the counting stages, to switch through the switch, belonging to the group of first switches, of the $(k+1)^{th}$ resistor of said number of fixed resistors and similarly for the switch belonging to the group of second switches of the first to the $k^{th}$ resistors of said number of fixed resistors. Thereby can the control means include a number of diodes by which the control leas of both the switches of each individual resistor of said number fixed resistors are connected to the control leads of the switches belonging to the group of second switches of the preceding resistors in series.

With regard to the second part of the counting stages, the apparatus can, with a relatively small number of counting positions in this second part, be so constructed practically that the second part of the counting stages of the counter consists of a ring counter stepped on to the next counting stage by each switching impulse applied to the input side of the second part of the counting stages and the control leads of the electronic switch or switch means of the series are connected following a counting stage of the ring counter. In this case the electronic switch can be substituted by a special coordinator between the second part of the counting stages and the control leads.

If, however, a greater number of counting positions is necessary for the second part of the counting stages of the counter it is practical to arrange that the second part of the counting stages of the counter consists of binary counting stages and at the second part of the counting stages a diode matrix is connected with a number of outlet leads corresponding to the maximum state of count of the second part of the counting stages which delivers an output signal over an output lead associated with a condition of count of the second part of the counting stages and in that the control leads of the electronic switch or switch means of the series are connected following each one of the output leads.

The apparatus can finally with advantage be so constructed that for the delivery of a fifth voltage linearly dependent on the fourth voltage, third means are provided which include a direct voltage amplifier to the input of which the fourth voltage is applied and whose output voltage forms the fifth voltage.

In the construction of the present apparatus as an analog/digital converter, it may include a number impulse generator and/or a number impulse input leading to the converter for external control, a number impulse lead connected to the number impulse generator and/or the number impulse input, a digital counter connected to the impulse lead and/or a number impulse outlet connected to the number impulse inlet for delivering the determined digital value in the form of impulse series, an analog input for supplying a value in the form of an analog voltage, a comparator for comparing the input voltage $U(n)$ of the generator with the analog voltage and for generating an output signal as soon as the output voltage $U(n)$ has a magnitude equal to that of the analog voltage, means responsive to the output signal of the comparator for interrupting the number impulse lead or disconnecting the number impulse generator and connecting means for connecting the main control input of the generator to the number impulse lead.

The apparatus can, however, also easily be constructed as a waveform generator because it has either a control impulse generator connected on the output side with the main control input or only a control impulse input to which the main control input is connected.

A forced polygonal outline, if required in the proportion of the fifth to the fourth voltage, arises as an output voltage $U(n)$ of the generator contained in the apparatus; the sections of said outline are each formed from the voltage rising linearly with $n$ with an adjustable change in voltage and the median voltages on the breaks of the polygonal outline are each formed from the third voltage. The third voltages coordinated with successive counting positions of the second part of the counting stages of the counter must be undercut accordingly by the product of the maximum counter position of the first part of the counting stages of the counter and the change in voltage of the first or second voltage per counting step of the first part of the counting stages, said change in voltage being adjusted with the lower of the two consecutive counting positions of the second part of the counting stages.

If the first part of the counting stages of the counter consists of binary counting stages, several of these binary counting stages can be provided with counting inputs which are individually connectable to the main control input by means of the said connection means connecting each one of the counting inputs with the main control input. The connection means can thus comprise, by way of example, a multipoint switch. With such a construction further counting results in the first part of the counting stages of the counter, with every control impulse delivered to the main control input, to a specified number of counting steps with the counting input of the $p$th binary county stage connected with the main control input at every $2^{p11}$ counting steps. Thus the spacing of the median points of the polygonal outline in a graph $U(n)$ or the number of control impulses, which are each followed by a break in the outline, is adjusted as needed.

With the polygonal outline, the desired nonlinear dependence of the output voltage $U(n)$ on the number of $n$ of the control impulses delivered is reproduced. To obtain the desired shape of the polygonal outline, the resistances which are associated with the separate electronic switches and which, as a whole, form either the resistance variable with the first electronic switches or switching devices, or the said first and said second voltages parts, are correspondingly selected.

An embodiment of the invention is explained in the following with reference to the drawings in which.

Figure 3:
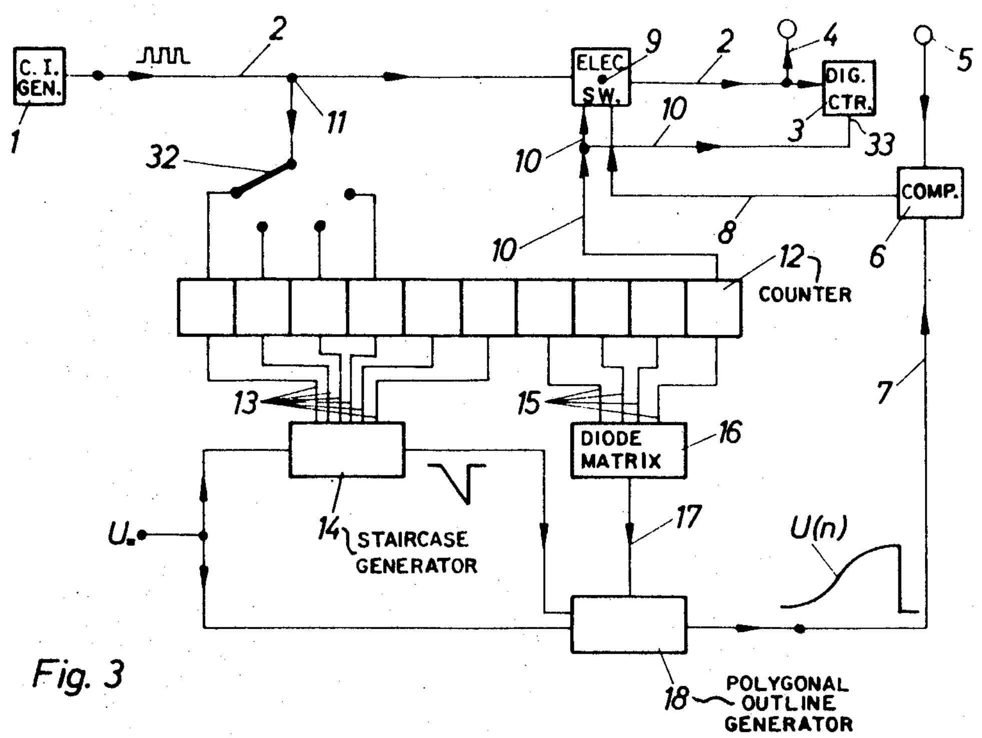
FIG. 3 is schematic circuit diagram of an embodiment of the present device.
Figure 4:
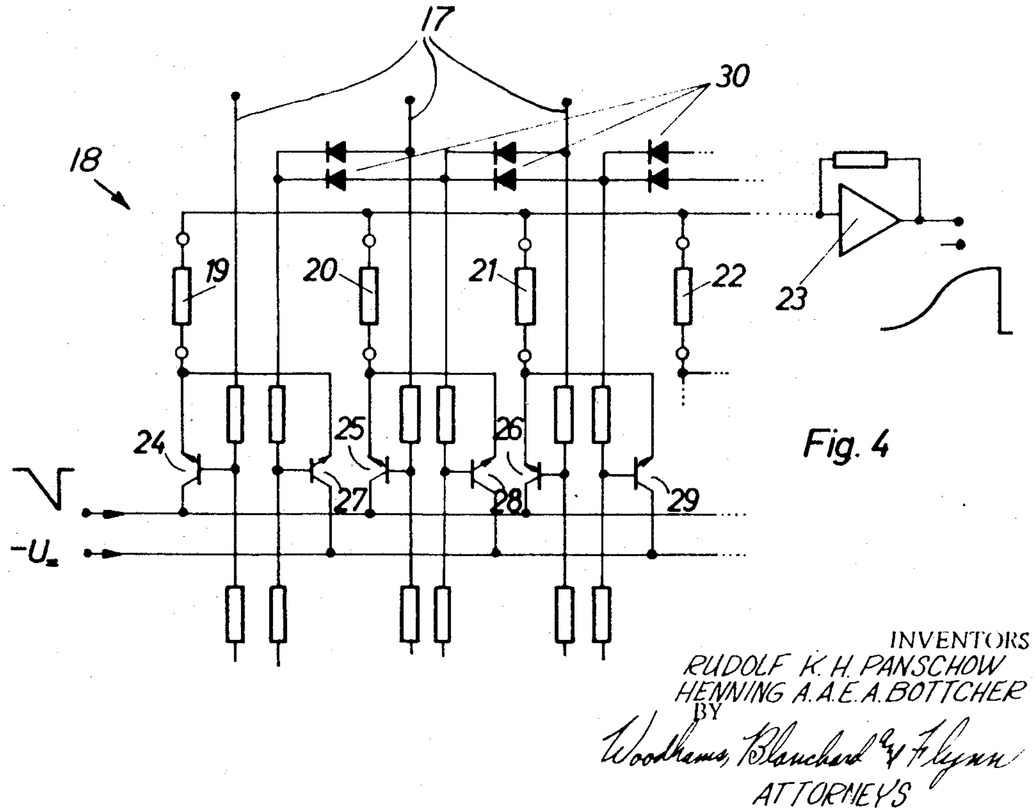
FIG. 4 is a schematic illustration of the construction within the circuit 18 in FIG. 3.

The analog/digital converter shown in FIG. 3 as an embodiment of the present apparatus contains, as usual, a number or control impulse generator 1, a number or control impulse lead 2 connected to the number impulse generator, a digital counter 3 connected to the number or control impulse circuit as well as a number impulse output 4 connected to said circuit for delivering the determined digital values in the form of impulse series, an analog input 5 for applying a value in the form of an analog voltage, a comparator 6 for the comparison of the voltage $U(n)$ delivered over the circuit 7 with the analog voltage applied to the analog input 5 and for delivering an output signal over the circuit 8, as soon as the voltage $U(n)$ has reached the same level as the analog voltage applied to the analog input 5 and an electronic controlled switch 9 which is opened by the rising edge of the output signal of the comparator 6 and closed by the rising edge of the signal applied over the circuit 10.

The analog/digital converter shown in FIG. 3 also includes a generator formed from all the remaining parts shown in FIG. 3, to the input side of which are applied, over a main control input 11, control impulses formed from the number impulses of the number impulse generator 1 and which provides, on the output side, the output voltage $U(n)$ over the circuit 7.

The generator includes a counter 12 which is formed as a binary counter and constructed in known manner from several toggle stages representing the individual binary stages. The counting stages of a first part of this counter 12 are connected with a step voltage generator or staircase 14 over the circuits 13 and each one of the circuits 13 is permanently connected over an evaluated resistor to an adding amplifier which produces the first voltages representing the individual sections of the above-mentioned polygonal outline. The counting stages of the second part of the counter 12 are connected by circuits 15 with circuits 15 with a diode matrix 16 which has an output for every median point of the polygonal outline; the output leads 17 of said matrix are connected to the control circuit of a wave or polygonal outline generator 18 which contains the said first to fifth means. The wave generator 18 sets the required gradient of each section of the polygonal outline on the median points of the polygonal outline. The wave generator 18 is so designed that therein, either a constant voltage $U=$ or the first, linearly rising voltage supplied by the step voltage generator 14 is connected to an adding amplifier 23 over one and the same resistance 19 or 20, 21, 22 for each section of the polygonal outline. The signal applied by the diode matrix 16 to the output associated with each counter position of the second part of the counting stages connects through the transistor 24 or 25, 26 associated with this output, for the step voltage, whilst the transistors 27 or 28, 29 for the said constant voltage of the previous areas are connected through by a diode control 30. The resistances 19, 20, 21, 22 thus each form the longitudinal or input branch of the voltage divider or resistance summing network and the input resistance of the adding amplifier 23, the diagonal or output branch. The voltage $U(n)$ in the form of the polygonal outline is then available at the output of the adding amplifier 23, and is transmitted to the lead 7.

Since the state of count of the first part of the counting stages of the counter 12 does not have to be connected with the position of the digital counter 3 in a particular manner, it is sufficient that the control impulses applied by way of the main control input 11 are supplied to any stage of the first part of the counting stages of the counter 12. Thus the possibility arises to alter, in the simplest way, namely, for example, by actuating the single-pole multicontact switch 32, the polygonal outline produced in relation to the number of control impulses for each section of the polygonal outline and the number of median points. If, for example, the control impulses, as in FIG. 3, are delivered to the first counting stage of the counter 12, then 64 control impulses have to be applied over the main control input 11 before the diode matrix 16 marks a new median point. If, on the other hand, the control impulses are delivered to the fourth counting stage (last switching position of the multicontact switch 32), then a new median point is marked after every eight control impulses.

In order to be able to adjust a certain, desired development to the development of the output voltage $U(n)$ with $n$, only the resistances 19, 20, 21, 22 and so must be interchangeable and, if required, the multicontact switch 32 be adjusted.

The resistance 19, 20, 21, 22 and so on can be suitably housed in a special small container and connected with the analog/digital converter by a plug and socket connection. The main control input 11 can also be connected with a specific number input of the counter 12 over the plug and socket connection, and in this case, the multicontact switch 32 would not then be used.

Each specific outline of the output voltage $U(n)$ with $n$ is then associated with the individual small containers. Each one of these small containers can be associated with one of a number of measuring transformers which can be controlled by the analog/digital converter.

Figure 1:
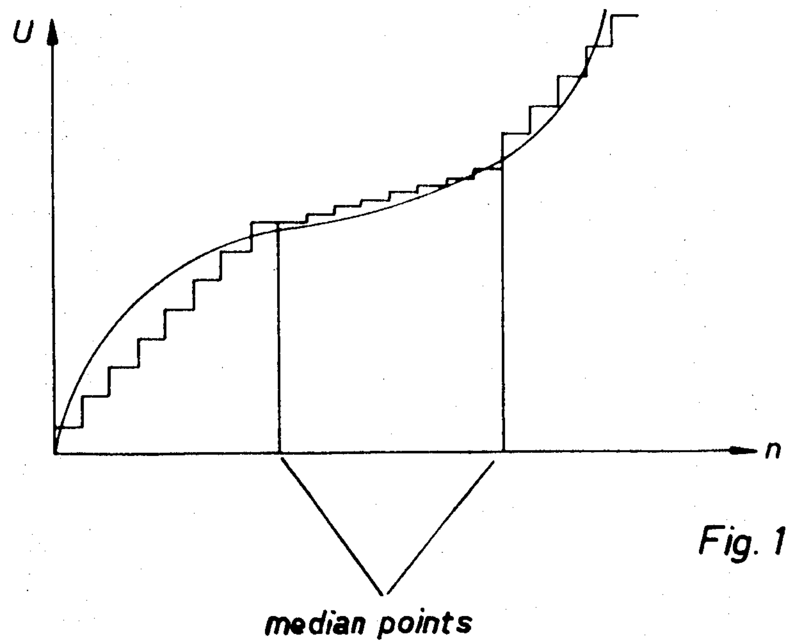
FIG. 1 is an example of the development of the output voltage $U(n)$ of the generator contained in a device according to the invention.
Figure 2:
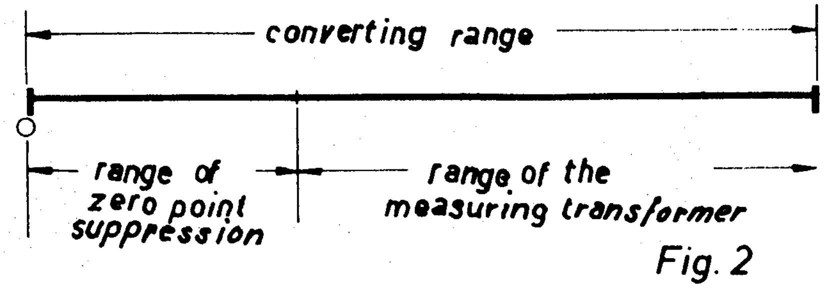
FIG. 2 is a drawing illustrating the zero point suppression with analog quantities which are conveyed to an analog/digital converter over a measuring transformer.

Since the range of many measuring transformers does not begin with the value 0, of the respective physical quantities concerned, i.e. the voltage delivered by the measuring transformer on the output side is not directly proportional to the physical quantity applied to the measuring transformer on the input side, but is proportional to the difference between the value of the applied physical quantity and a constant basic value of this said quantity, the digital counter 3 of the analog/digital converter in FIG. 3 must first be adjusted to a position of count corresponding to the constant basic value before the digital value of the analog voltage corresponding to the difference between the physical quantity and its basic value and be counted into the digital counter 3. This process of adjusting the digital counter 3 to a state of count corresponding to the suppressed constant basic value of the physical quantity is known as the zero point suppression (see FIG. 2).

With the analog/digital converter shown in FIG. 3, this adjustment of the digital counter 3 to the state of count corresponding to the basic value of the physical quantity is effected by means of a setting impulse which is derived on the setting input 33 of the digital counter 3 from the wave front of the signal delivered over the circuit 10.

The analog/digital converter shown in FIG. 3 determines digital values extending serially, and moreover, in the time spacing of a complete passage of the counter 12. Every time the first counting stage of the second part of the counting stages of the counter 12 is again switched to "0" an output signal is delivered over to lead 10; the setting impulse for the digital counter 3 and the switching through impulse for the switch 9 are then derived from the wave front of said output signal.

With known analog/digital converters, the initial value of the range of the measuring transformer had to be selected from the highest decade of the digital counters with an AND gate and then started with the generation of the above-mentioned sawtooth voltage.

If the digital counter 3 is to be used for the same purpose for which the counter 12 is used in the described analog/digital converter, then an AND gate would be necessary for each of the median points of the polygonal outline as well as for the zero point suppression, whereby, for example, on an average, nine diodes per median point or zero point suppression are necessary in an electronic decade digital counter designed for example, in the 1-2-4-8 code with three decades. If the outline of the count $U(n)$ with $n$ was now to be altered, then about 99 diodes would have to be interchanged apart from other structural elements with, for example, 10 median points and a zero point suppressor, because they have to be switched to other points on the counter.

Furthermore, the digital counter 3 cannot be used for producing the step voltage since, according to the limit applied to the zero point suppression in another counter position, it must begin with producing the step voltage.

Such disadvantages do not occur with the present analog/digital converter, because in addition to the digital counter necessary for counting the impulses, there is still the counter 12, and the limit to be worked by the analog/digital converter is divided into a range of zero point suppression and a range of the measuring transformer (FIG. 2) and the position of the median points is related to the limit of the measuring transformer. For example, it can be specified that with every 16th digital value of the measuring transformer limit, there should be a median point on which the gradient of the step voltage is reversed. Since the counter 12 in FIG. 3 is reset in all possible limits of the measuring transformer at the same time as the setting impulse which causes the adjustment of the counter 3, and then this impulse begins to count a "zero", the AND gates for the median point reversal (diode matrix 6) can now be fixedly connected to the counter 12, independent of the size of the limit of the zero point suppression.

What we claim is:

1. Electronic apparatus including a curve-generator to which curve-generator control impulses are applied over a main control input of said curve-generator and which curve-generator generates an output voltage $U(n)$ having a magnitude dependent on the number $n$ of said applied control impulses, wherein said curve-generator comprises a counter having first and second parts and having at least one counting input connected to the first counting stage of said counter, connecting means for connecting said counting input to the main control input, a voltage generator having control inputs which are connected to the counting stages of said first part of said counter, said voltage generator being provided for producing a first voltage linearly dependent on the state of count of said first voltage linearly dependent on the stare of count of said first part of said counter, first means responsive to the state of count of the counting stages of the remaining second part of the counter for setting the voltage change by which a second voltage linearly dependent on said first voltage changes with one counting step in said first part of the counter, second means for forming a fourth voltage by raising said second voltage by the value of a third voltage dependent on the state of count of said second part of the counter, and the third means for giving out of said curve-generator a fifth voltage linearly dependent on said fourth voltage as the output voltage $U(n)$, said first means including a first resistance summing network including first electronic switching means, said first voltage being applied to the input side of said first network, said second means including a second resistance summing network including second electronic switching means, means applying a constant voltage to the input side of said second network, said first and second networks having each a separate input branch and together a common output branch, a number of constant resistances provided to form said input branches being connected to one end of said input branches being connected to one end of said output branch, said number being equal to the sum of 1 and the maximum state of count of said second part of the counter, each of said constant resistances being connected at its end remote from said output branch with two electronic switches, one of said two switches belonging to said first electronic switching means and connecting, when switched on, the respective resistance thereof to said first voltage produced by said voltage generator and the other of said two switches belonging to said second switching means and connecting, when switched on, the respective resistance thereof to said constant voltage, said constant voltage having a value equal to the value of said first voltage at a state of count of said first part of the counter which is the maximum state of count of this first part, and control means for switching on, at a state of count $k$ of said second part of the counter, that electronic switch belonging to said first electronic switching means and being connected to the $(k+1)^{th}$ resistance of said number of constant resistances and further all electronic switches belonging to said second electronic switching means and being connected to the $1^{st}$ to $k^{th}$ resistance of said number of constant resistances.

2. Apparatus according to claim 1, wherein said control means includes a control lead connected to one of said electronic switches of said first electronic switching means and a number of diodes, said one electronic switch being connected to a certain one of said number of constant resistances, said control lead also being connected by one of said diodes to a further electronic switch, said further electronic switch being of said second electronic switching means and being the one thereof connected to that resistance of said number of constant resistances which precedes in succession said certain one resistance.

3. Apparatus according to claim 2, wherein said second part of the counter consists of a ring counter having only one of its counting stages energized and all other counting stages unenergized and shifting the energized state by one counting stage with every switching impulse applied to the input side of said second part counting stages of the counter, said of the ring counter being connected each with one of the control leads of the electronic switches belonging to said first electronic switching means, and that in the succession of the constant resistances to which the respective electronic switches belong.

4. Apparatus according to claim 2, wherein said second part of the counter consists of binary counting stages and a diode matrix being connected with said second part of the counter, which diode matrix having a number of outlet leads corresponding to said number of constant resistances and which diode matrix being provided to energize these outlet leads one after another in the succession of the states of count of said second part of the counter, said outlet leads of the diode matrix being connected each with one of the control leads of the electronic switches belonging to said first electronic switching means, and that in the succession of the constant resistances to which the respective electronic switches belong.

5. Apparatus according to claim 1, comprising a direct current amplifier, said fourth voltage being the input voltage of said amplifier and said fifth voltage being the output voltage of said amplifier.

6. Apparatus according to claim 1, wherein at least said first part of the counter consists of binary counting stages.

7. Apparatus according to claim 1, wherein said voltage generator is a staircase generator, the output voltage of which forming said first voltage and changing, correspondingly to the stepwise increase of the state of count of said first part of the counter, stepwisely every time by one voltage step.

8. Apparatus according to claim 6, wherein said voltage generator comprises a voltage-dividing circuit with a second resistance connected to a junction point and a number of first resistances, which number corresponds to the number of counting stages of said first part of the counter, each of said first part of the counter, each of said first resistances being arranged between said junction point and one of said binary counting stages and being connected to a switching point of the binary counting stage having in the on-state of the binary counting stage a certain potential difference with respect to the end of said second resistance removed from said junction point and having in the off-state of the binary stage no potential difference to the same end of said second resistance, said potential difference being equal at all binary counting stages of said first part of the counter, the value of resistance of each of said first resistances connected to a certain binary counting stage being at least approximately a half of the value of resistance of the first resistance connected to the preceding binary counting stage and being further a multiple of the value of resistance of said second resistance.

9. Apparatus according to claim 8, wherein said second resistance is the input impedance of a direct voltage amplifier, the output voltage of which being said first voltage.

10. Apparatus according to claim 8, wherein the voltage dropping on said second resistance is said first voltage.

11. Apparatus according to claim 1 forming an analog-digital converter, comprising further a control impulse line, means applying said control impulses to said control impulse line, at least one of a digital counter connected to said control impulse line and a control impulse output connected to said control impulse line for delivering determined digital values in form of impulse series, an analog input for supplying an analog value in form of an analog voltage, a comparator for comparing the output voltage $U(n)$ of said curve-generator with said analog voltage and for generating an output signal as soon as the output voltage $U(n)$ of said curve-generator has a magnitude being equal to that of said analog voltage, means responsive to the output signal of the comparator for preventing actuation of said digital counter and control impulse output from said control impulse line, and connecting means for connecting said main control input of the curve-generator to said control impulse line.

UNITED STATES PATENT OFFICE
CERTIFICATE OF CORRECTION

Patent No. 3 611 351 Dated October 5, 1971

Inventor(s) Rudolf K.H. Panschow & Henning A.A.E.A. Böttcher

It is certified that error appears in the above-identified patent and that said Letters Patent are hereby corrected as shown below:

Column 7, line 17; should be deleted in its entirety.

Column 7, line 37; delete the phrase "said input branches being connected to one end of".

Column 8, line 2; line 2 should be deleted in its entirety and rewritten to read ---said second part of the counter, said counting stages of the---.

Column 8, lines 35 and 36; the phrase "each of said first part of the counter," should be deleted.

Signed and sealed this 16th day of May 1972.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334